US010411625B2

(12) United States Patent
Magini et al.

(10) Patent No.: US 10,411,625 B2
(45) Date of Patent: Sep. 10, 2019

(54) METHOD AND DEVICE FOR DETECTING A SPEED IN A GENERATOR UNIT

(71) Applicant: Robert Bosch GmbH, Stuttgart (DE)

(72) Inventors: Fabio Magini, Hemmingen (DE); Manuel Mueller, Kisslegg (DE); Michael Wohlfarth, Gerlingen (DE); Miriam Riederer, Fellbach (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/776,962

(22) PCT Filed: Oct. 28, 2016

(86) PCT No.: PCT/EP2016/076003
§ 371 (c)(1),
(2) Date: May 17, 2018

(87) PCT Pub. No.: WO2017/084856
PCT Pub. Date: May 26, 2017

(65) Prior Publication Data
US 2018/0331642 A1 Nov. 15, 2018

(30) Foreign Application Priority Data

Nov. 18, 2015 (DE) .................. 10 2015 222 717
Dec. 1, 2015 (DE) .................. 10 2015 223 900

(51) Int. Cl.
| H02P 9/00 | (2006.01) |
| H02P 9/08 | (2006.01) |
| H02P 29/024 | (2016.01) |
| H02P 101/25 | (2016.01) |
| G01P 3/48 | (2006.01) |
| G01R 31/34 | (2006.01) |

(52) U.S. Cl.
CPC .......... *H02P 9/006* (2013.01); *G01P 3/48* (2013.01); *G01R 31/343* (2013.01); *H02P 9/08* (2013.01); *H02P 29/0241* (2016.02); *H02P 2101/25* (2015.01); *H02P 2203/09* (2013.01)

(58) Field of Classification Search
USPC ..................... 322/11, 28, 46; 310/114
See application file for complete search history.

(56) References Cited

U.S. PATENT DOCUMENTS

| 1,746,333 | A | * | 2/1930 | Baudisch | H02K 17/42 307/84 |
| 1,821,364 | A | * | 9/1931 | Storer | B60L 9/10 318/100 |
| 2,160,594 | A | * | 5/1939 | Krebs | H02K 19/36 307/104 |
| 3,809,914 | A | * | 5/1974 | Kilgore | H02P 9/08 290/38 R |
| 4,868,480 | A | * | 9/1989 | van der Linde | H02J 7/1438 322/7 |
| 5,055,764 | A | * | 10/1991 | Rozman | F02N 11/04 290/31 |
| 5,397,975 | A | * | 3/1995 | Syverson | H02J 7/1423 310/181 |
| 5,502,368 | A | * | 3/1996 | Syverson | H02J 7/1423 310/181 |
| 5,631,544 | A | * | 5/1997 | Syverson | H02J 7/1423 322/46 |
| 5,656,922 | A | * | 8/1997 | LaVelle | H02J 7/1423 310/181 |
| 5,693,995 | A | * | 12/1997 | Syverson | H02K 1/2773 310/114 |
| 5,710,471 | A | * | 1/1998 | Syverson | H02J 7/1423 310/114 |
| 5,747,909 | A | * | 5/1998 | Syverson | H02H 7/06 310/114 |
| 5,753,989 | A | * | 5/1998 | Syverson | B60L 50/15 310/114 |
| 5,982,155 | A | * | 11/1999 | Rechdan | H02J 7/245 318/400.31 |
| 6,081,103 | A | * | 6/2000 | Pierret | H02J 7/245 318/254.2 |

(Continued)

FOREIGN PATENT DOCUMENTS

| CN | 102636751 | 8/2012 |
| DE | 102011007331 | 10/2012 |
| DE | 102015211933 | 12/2016 |

OTHER PUBLICATIONS

International Search Report for Application No. PCT/EP2016/076003 dated Jan. 30, 2017 (English Translation, 3 pages).
Penman, J. et al., "The detection of stator and rotor winding short circuits in synchronous generators by analysing excitation current harmonics," Opportunities and Advances in International Electric Power Generation, International Conference on (Con. Publ. No. 419) Durham, UK, Mar. 18-20, 1996, London, UK, IEE, UK, pp. 137-142, XP006510158.

*Primary Examiner* — Pedro J Cuevas
(74) *Attorney, Agent, or Firm* — Michael Best & Friedrich LLP

(57) ABSTRACT

A method for determining a speed (nG) of a generator unit which has an electric machine (100) with a rotor winding (110) and a stator winding (120) and a rectifier (130) connected thereto, via which rectifier the electric machine (100) is connected to an electrical system (150) of a motor vehicle, the speed (nG) being determined depending on the plot of an excitation current (IE) flowing through the rotor winding (110) of the electric machine (100). In particular, the speed is determined from a known relationship between the speed, the frequency of the excitation current, the number of pole pairs and optionally the number of phases when there is an error that leads to a constant phase voltage being output.

13 Claims, 6 Drawing Sheets

(56) References Cited

U.S. PATENT DOCUMENTS

| | | | | |
|---|---|---|---|---|
| 6,236,134 B1* | 5/2001 | Syverson | ............ | H02K 1/2773 |
| | | | | 310/181 |
| 8,773,081 B2* | 7/2014 | Akita | ...................... | H02P 9/305 |
| | | | | 322/22 |
| 8,836,292 B1* | 9/2014 | Klughart | ................... | H02P 9/14 |
| | | | | 322/24 |
| 9,841,467 B2* | 12/2017 | DeMarco | ............. | G01R 31/343 |
| 10,050,573 B2* | 8/2018 | Wang | ...................... | H02P 9/007 |
| 2009/0091289 A1 | 4/2009 | Nandi et al. | | |
| 2016/0103189 A1* | 4/2016 | DeMarco | ............. | G01R 31/343 |
| | | | | 324/764.01 |
| 2016/0285399 A1* | 9/2016 | Wang | ...................... | H02P 9/007 |
| 2018/0340969 A1* | 11/2018 | Mueller | .............. | G01R 31/343 |
| 2018/0356467 A1* | 12/2018 | Reutlinger | ................ | H02P 9/48 |

* cited by examiner

METHOD AND DEVICE FOR DETECTING A SPEED IN A GENERATOR UNIT

BACKGROUND OF THE INVENTION

The present invention relates to a method for detecting a speed in a generator unit as well as to an arithmetic unit, in particular a generator controller, and a computer program for carrying out the method.

Motor vehicles are equipped with an electrical system which is supplied with voltage via an electric machine, e.g. an externally excited synchronous machine, operated as a generator. In order to control the electrical system voltage, an excitation current of the electric machine can be controlled. The electric machine is generally connected to the electrical system via a rectifier and with said rectifier forms a generator unit. Errors such as, e.g., short circuits can occur in such generator units, which errors should be detected whenever possible.

The German patent application DE 10 2015 211 933, which is not pre-published, discloses a method for detecting an error in a generator unit, which comprises an electric machine with a rotor winding and a stator winding and a rectifier connected thereto, via which the electric machine is connected to an electrical system, wherein a voltage of the electrical system is controlled to a target value via an excitation current flowing through the rotor winding of the electric machine and a plot of the excitation current is monitored, and wherein it is concluded that there is an error in the generator unit if an oscillatory plot of the excitation current is detected, wherein a magnitude of the oscillation lies above a threshold value.

SUMMARY OF THE INVENTION

According to the invention, a method for detecting a speed of a generator unit as well as an arithmetic unit and a computer program for carrying out the method are proposed.

In a first aspect, the invention relates to a method. This is based on the knowledge that an oscillation is impressed on an excitation current flowing through a rotor winding of a generator unit by means of the magnetic coupling of the rotor to a stator of the generator unit. The speed nG or the generator unit, i.e. the speed with which the rotor rotates in the stator, can then be determined from said oscillation. In particular each electric machine that can be operated as a generator can be understood in this context as a generator unit.

Provision can particularly be made for the speed to be detected depending on an analysis of a frequency spectrum of the plot of the excitation current or depending on an edge detection in the plot of the excitation current.

In a further aspect, provision can be made for the speed to then be determined, in particular only then, depending on the plot of the excitation current if an error is present in the generator unit. The term "error" can be so broadly understood that it includes deviations from the normal operation. In particular, an operation of a generator unit equipped with active rectifier elements during a so-called load-dump operation, in which a surge in the vehicle electrical system is reduced by the actuation of active rectifier elements in the rectifier, can also be understood as an "error". It has been recognized that the speed of the generator unit can be easily determined from the excitation current when an error is present.

Provision can particularly be made here for the speed to be determined depending on a plot of a phase voltage if an error is not present in the generator unit. A determination dependent on a plot of an output voltage of the generator unit, which is applied between a high-side connection of the generator unit and as low-side connection of the generator unit, is also possible.

Provision can be made in a further aspect for the speed to be determined depending on the plot of the excitation current if the phase voltage is fixed at a constant value. This is based on the knowledge that, if the phase voltage assumes a constant value, either a short circuit in the high-side or low-side path of the phase connected to the controller is present or a line which transmits the signal of the phase voltage to the controller is defective. In the first case, the phase voltage lies constantly at the level of the high-side connection, in the second case constantly at the level of the low-side connection, in the third case, depending on the circuitry in the controller, at a constant level which is not less than the smaller of these two voltage values and not greater than the larger of these two voltage values. The word "fixed" can mean here that a time period during which the phase voltage assumes the constant value is extended in relation to a time period during which the phase voltage during normal operation assumes the constant value at the same speed. The determination of the speed is particularly easy also in these cases.

In a further aspect, provision can be made for the speed to be determined depending on the constant value of the phase voltage or depending on the height of the amplitude of oscillation of the excitation current. It has, in fact, been recognized that the speed of the generator impresses a different signal on the excitation current in the error images described above.

In particular, the speed as nG=f/PPZ can be determined from a frequency f of the excitation current if the phase voltage lies on a high-side voltage level or on a low-side voltage level of the vehicle electrical system. Alternatively or additionally, the speed as $$nG=f/(PPZ \cdot AP \cdot 2)$$

can be determined from the frequency f of the excitation current if the phase voltage lies between a high-side voltage level and a low-side voltage level of the vehicle electrical system. (This applies particularly to the case where the circuitry of the phase connection in the controller does not lead to ground potential or B+ potential in this case.) PPZ denotes a pole pair number of the generator, AP the number of phases of the generator.

Provision can be made in a further aspect for a start-up of the generator unit to be initiated if it is recognized that a speed determined depending on the frequency of the excitation current lies above a speed threshold. When starting an internal combustion engine to which the generator is coupled, the speed of the generator unit can be used to trigger a start-up of the generator unit.

In addition, provision can be made for an emergency start speed nNot. If it is determined that the speed nG of the generator is greater than the emergency start speed nNot and the generator unit has not yet been started, the generator unit is then started in a secured operation.

Provision can be made here for the generator unit to be started in the secured operation if an oscillation of the excitation current is greater than a threshold value and additionally the frequency f of the excitation current lies above a corresponding frequency fNot of the emergency start speed nNot, wherein fnot=nNot·PPZ.

Alternatively or additionally, provision can be made for the generator unit to be started in a normal operation if an oscillation of the excitation current is smaller than a threshold value and additionally the frequency of the excitation current lies above a corresponding frequency of the emergency start speed:

$$f\text{not}=nG\cdot(PPZ\cdot AP\cdot 2).$$

This is based on the knowledge that, in the case of an error in the rectifier, in particular in the case of a short circuit in a phase, the phase voltage of which is determined (as is illustrated in FIG. 2 or 3), the excitation current executes an oscillation with a large amplitude and oscillates with the frequency of the generator unit; whereas in the case that the signal line which transmits the determined phase voltage to the generator controller is defective, the excitation current executes an oscillation with a smaller amplitude and oscillates with a frequency that corresponds to the frequency of the generator unit multiplied by twice the number of phases of the generator.

An arithmetic unit according to the invention, in particular a generator controller, e.g. a control unit of a motor vehicle, is equipped, in particular in a program technical manner, to carry out a method according to the invention.

The implementation of the method in the form of a computer program is also advantageous because this entails particularly small costs, in particular if the control unit executing the program is used for further tasks and is therefore already present in the vehicle.

Further advantages and embodiments of the invention ensue from the description and the accompanying drawings.

The invention schematically depicted in the drawings on the basis of an exemplary embodiment and is described below with reference to the drawings.

DETAILED DESCRIPTION

Figure 1:
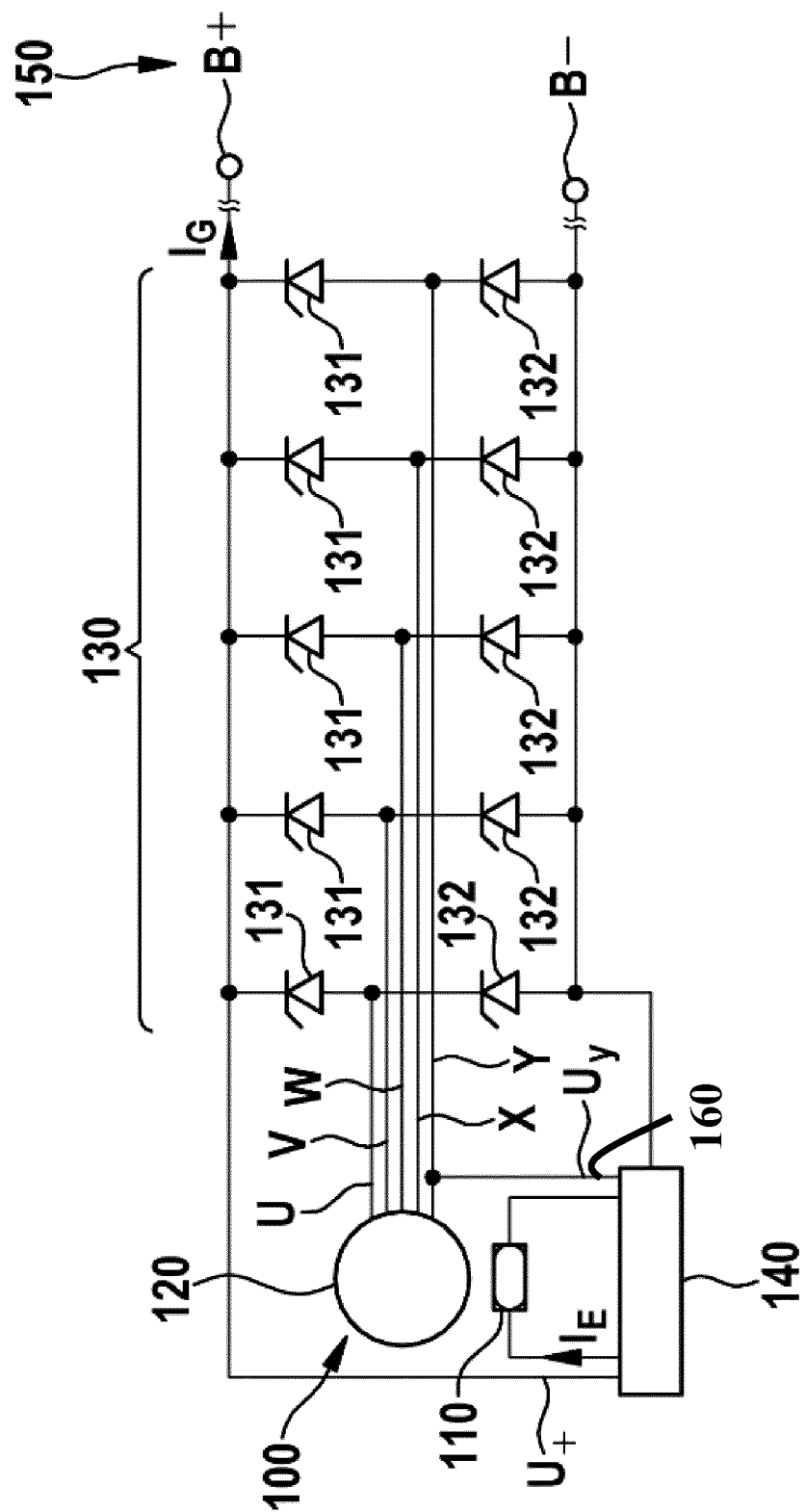
FIG. 1 shows schematically a generator unit comprising an electric machine, rectifier and generator controller, in which generator unit a method according to the invention can be carried out.

In FIG. 1, a generator unit comprising an electric machine 100 with a rectifier 130 and an arithmetic unit 140, which is designed as a generator controller and in which a method according to the invention can be carried out, is shown. The electric machine 100 has a rotor winding or respectively excitation winding 110 and a stator winding 120 and is used in the present embodiment as a generator for the voltage supply for an electrical system 150 of a motor vehicle.

The electric machine 100 and thus the stator winding 120 thereof is designed in the present case having five phases U, V, W, X and Y. Each of the five phases is connected via an associated diode 131 of the rectifier 130 to a positive side or high-side B+ of the vehicle electrical system 150 and via an associated diode 132 to a negative side or low-side B− of the vehicle electrical system 150. It goes without saying that the number five of the phases is selected only by way of example in the present case and that a method according to the invention can also be carried out with another number of phases, e.g. 3, 6, 7 or more. It is likewise possible to use suitable semiconductor switches instead of the diodes.

The generator controller 140 supplies the rotor winding 110 with an excitation current. To this end, a switch can be provided in the generator controller 140, which switch is connected in series with the rotor winding 110 and sets the excitation current $I_E$, for example, by means of a clocked control. Furthermore, the generator controller 140 has inputs for detecting the electrical system voltage with B+ and B− as well as a phase voltage, in the present case phase Y, with voltage $U_y$. The phase voltage $U_y$ is transmitted via a communication line 160 to the generator controller 140. A current outputted by the electric machine 100 is denoted with the reference sign $I_G$. The speed nG, at which the rotor winding 110 of the electric machine rotates, can be determined from a frequency fY of the phase voltage $U_Y$. The following relation applies here:

$$fY=nG\cdot PPZ,$$

wherein PPZ is a number of pole pairs of the generator. Such a detection of the speed nG can, for example, occur via a flank detection in the signal profile of the phase voltage $U_Y$ in the generator controller 140.

The excitation current IE also has a frequency component f having the frequency $$f=nG\cdot PPZ \text{ (in error case } I\text{), or}$$

$$f=nG\cdot(PPZ\cdot 2) \text{ (in error case } II\text{), or}$$

$$f=nG\cdot(PPZ\cdot AP\cdot 2) \text{ (in normal operation and in error case } III\text{).}$$

In error case I, a simple short circuit is present, i.e. a short circuit is present only in the high-side path or only in the low-side path of a phase. In this case, the oscillation in the excitation current IE has an increased amplitude with respect to the error-free normal case.

In error case II, an error is present in a complete strand, i.e. the connection in the high-side path as well as the connection in the low-side path is interrupted. In this case, the oscillation in the excitation current IE has an increased amplitude with respect to the error-free normal case.

In error case III, an error is present in the phase connection of the generator controller. In this case, the amplitude of the oscillation in the excitation current IE does not change with respect to the error-free normal case.

The detection of the speed nG can thus also occur via an analysis of the frequency spectrum of the excitation current IE, for example via an FFT. This is particularly expedient because the frequency mentioned above is only one of a plurality of frequency components of the excitation current IE.

Figure 2:
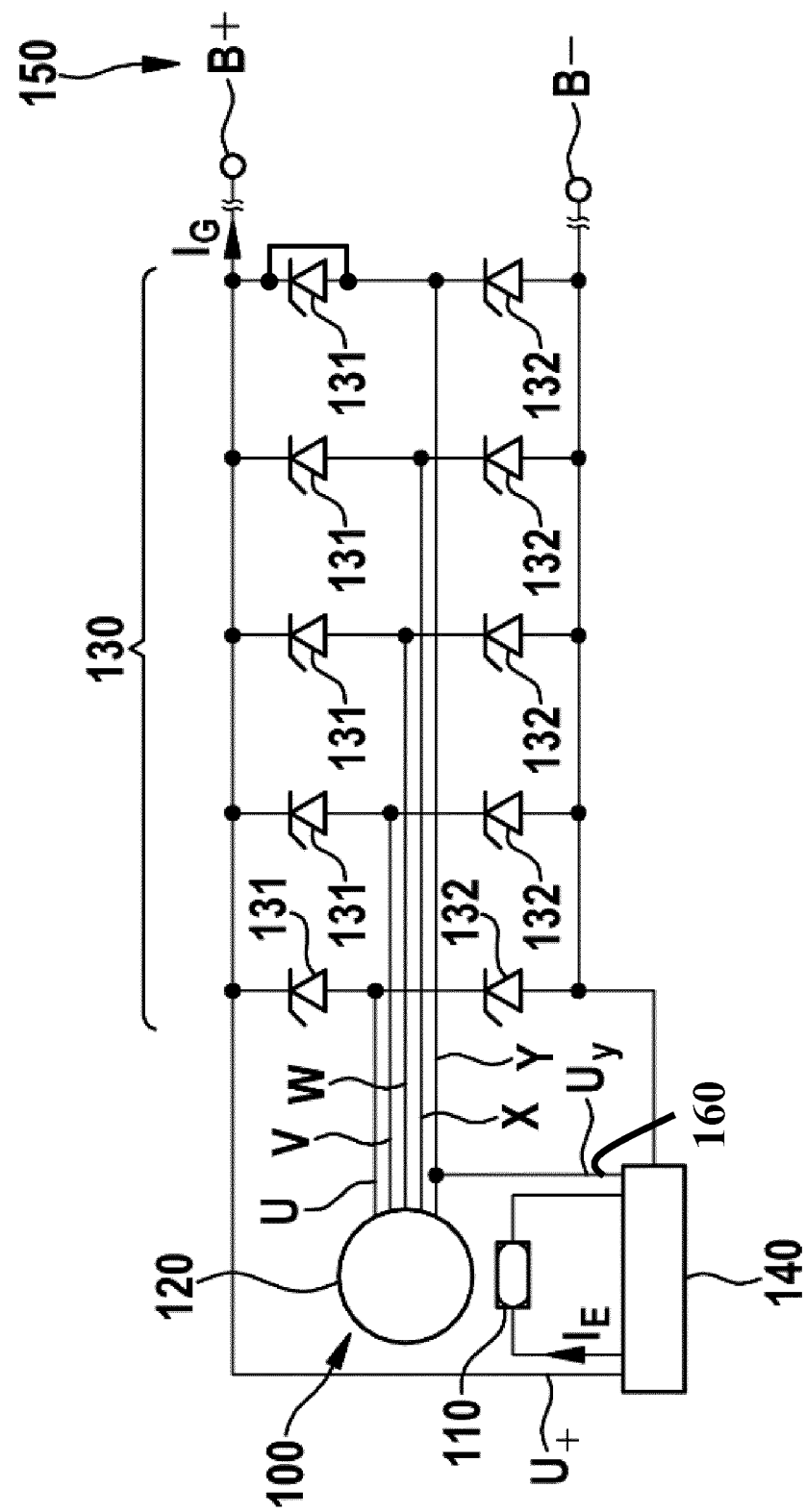
FIGS. 2 and 3 show the generator unit from FIG. 1 with different errors in the rectifier.
Figure 3:
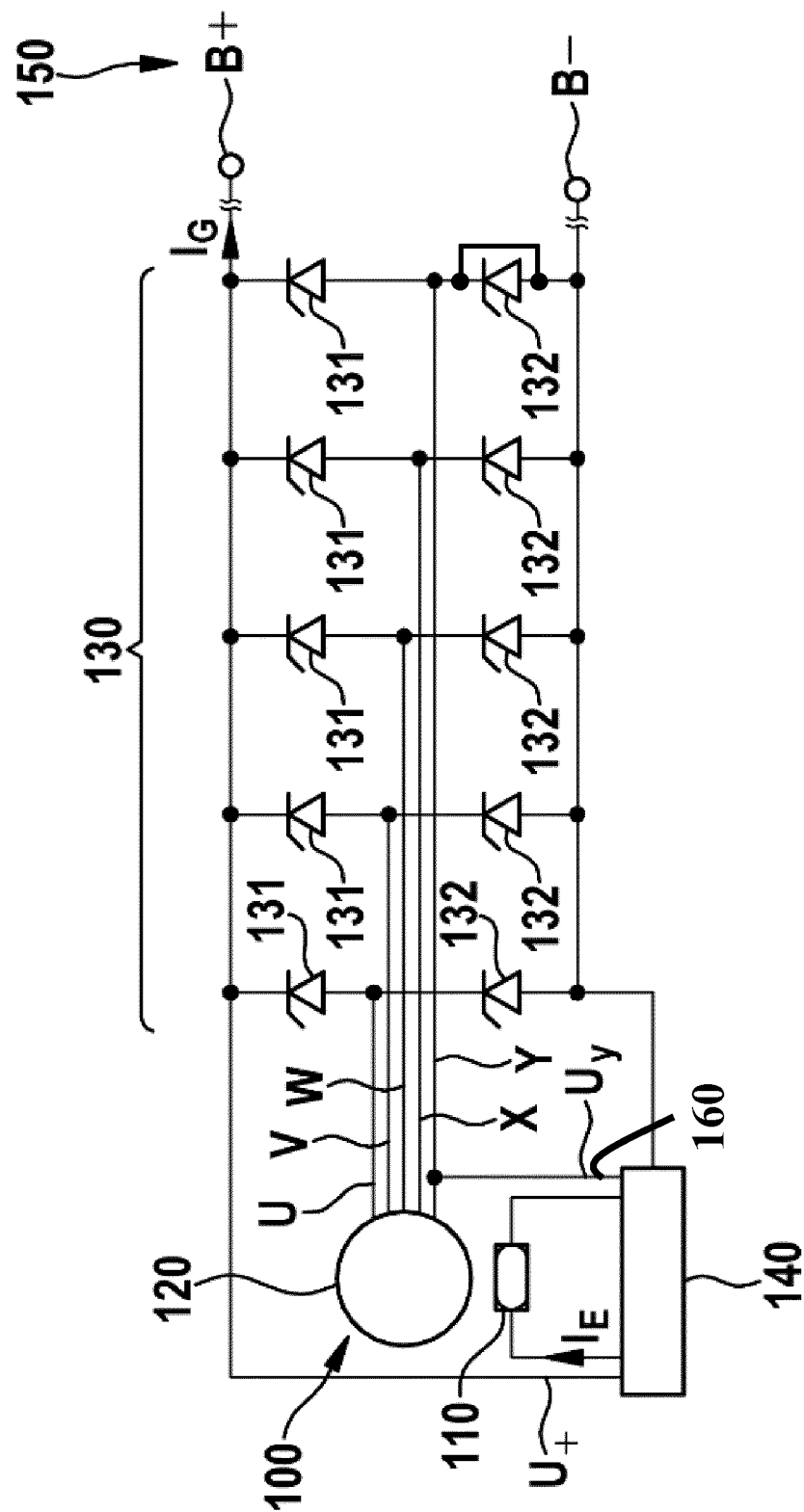

The arrangement from FIG. 1 is shown in each case in FIGS. 2 and 3 having respectively one specific error in the rectifier 130.

For example, a short circuit in the high-side path in the phase Y is shown in FIG. 2. This can, e.g., occur in the case of a short circuit of the associated diode 131.

In FIG. 3, a short circuit in the low-side path in the phase Y is shown by way of example. This can, e.g., occur in the case of a short circuit of the associated diode 132.

The behavior illustrated in FIG. 2 and FIG. 3 can result in the case of an active rectifier, in which switches, for example MOSFETs are provided instead of the diodes 131 and/or instead of the diodes 132 and can even result without a short circuit actually being present. In particular, if a so-called load dump is detected, provision can be made for these switches to be actuated for the reduction of surges either in the high-side path or in the low-side path in such a way that a short circuit results to the high-side or to the low-side, that therefore one or a plurality of switches are also then conductively connected, when the corresponding diode 131, 132 illustrated in FIG. 1 would block. The remarks regarding FIG. 4 or 5 can correspondingly be applied here.

Figure 4:
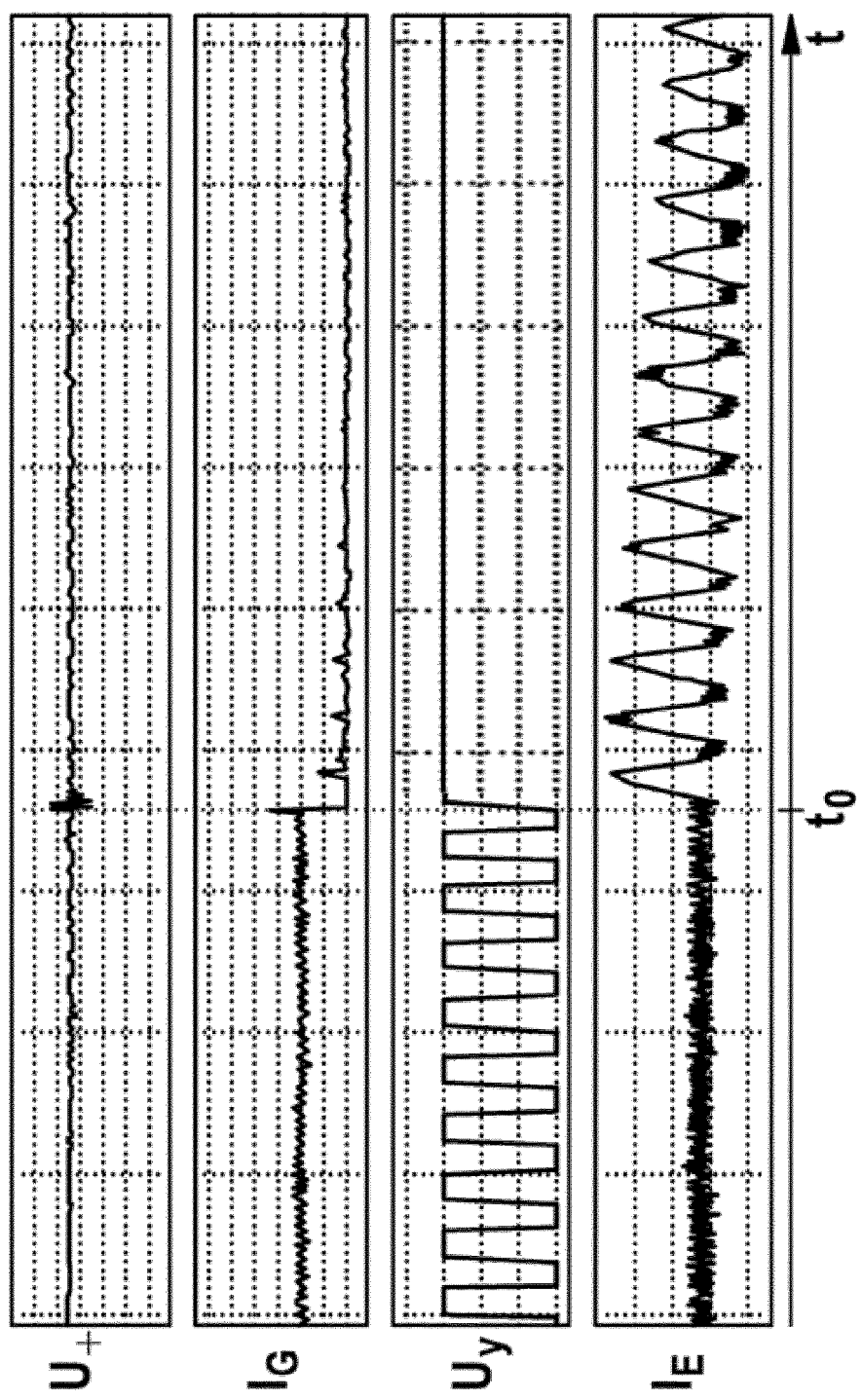
FIGS. 4 and 5 show in diagrams voltage and current profiles with respect to the errors shown in FIGS. 2 and 3.
Figure 5:
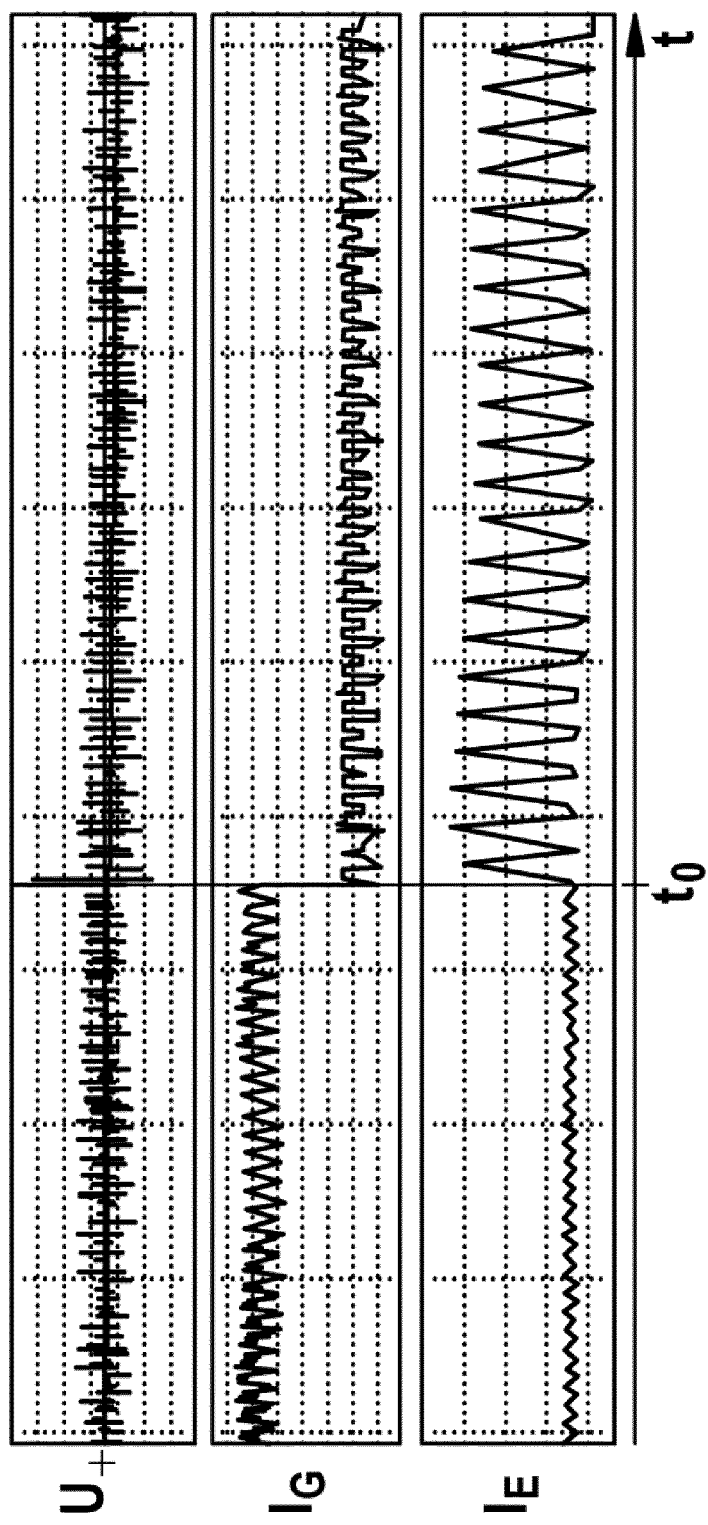

In FIGS. 4 and 5, plots of the generator voltage $U_+$, the generator current $I_G$, the phase voltage $U_Y$ of the phase Y (not in FIG. 7) and the excitation current $I_E$ are shown in each case over the time t. A normal operation of the arrangement prevails before the point in time $t_0$ and an error in the generator unit occurs at the point in time $t_0$. Plots, as they correspond to errors, such as shown in FIGS. 2 and 3, correspond to the plots in FIGS. 4 and 5. It should be noted here that the scaling of the individual diagrams in the case of current or respectively voltage as well as in the case of time does not always correlate, which is, however, not relevant for the present invention.

It can be seen in FIG. 4 that a short circuit in a high-side path at the generator voltage is noticeable only a short time after the error has occurred. The generator current decreases and the phase voltage changes with respect to the oscillation pattern thereof. A significant oscillation with high amplitude in comparison to the plot without error can be seen in the excitation current. After the error has occurred, a frequency component of the excitation current IE having the frequency results $$f = nG \cdot PPZ$$

This plot of the excitation current results from an unsymmetrical distribution of the phase currents after the short circuit, which then contain a direct current component. With the rotation of the electric machine, these unequal direct current components are then transmitted to the rotor because the externally excited synchronous machine can be considered to be like a transformer, which, on the one hand, enables a coupling of the rotor to the stator and on the other hand enables a back coupling from the stator to the rotor. The excitation current thereby receives a significant alternating current component, whereby the detection of the speed with respect to the normal operation is even more simply possible.

After the short circuit has occurred, the phase voltage $U_Y$ lies constantly at the voltage level of the high-side B+ of the vehicle electrical system 150.

It can be seen in FIG. 5 that a short circuit is noticeable in a low-side path at generator voltage only a short time after the error has occurred and that the generator current decreases. As also was the case for a short circuit in the high-side path, a significant oscillation with a high amplitude in comparison to the plot without error can be seen in the excitation current. For the frequency of the excitation current, that which was said in regard to FIG. 4 applies here.

After the short circuit has occurred, the phase voltage $U_Y$ lies constantly at the voltage level of the low side B− of the vehicle electrical system 150.

Figure 6:
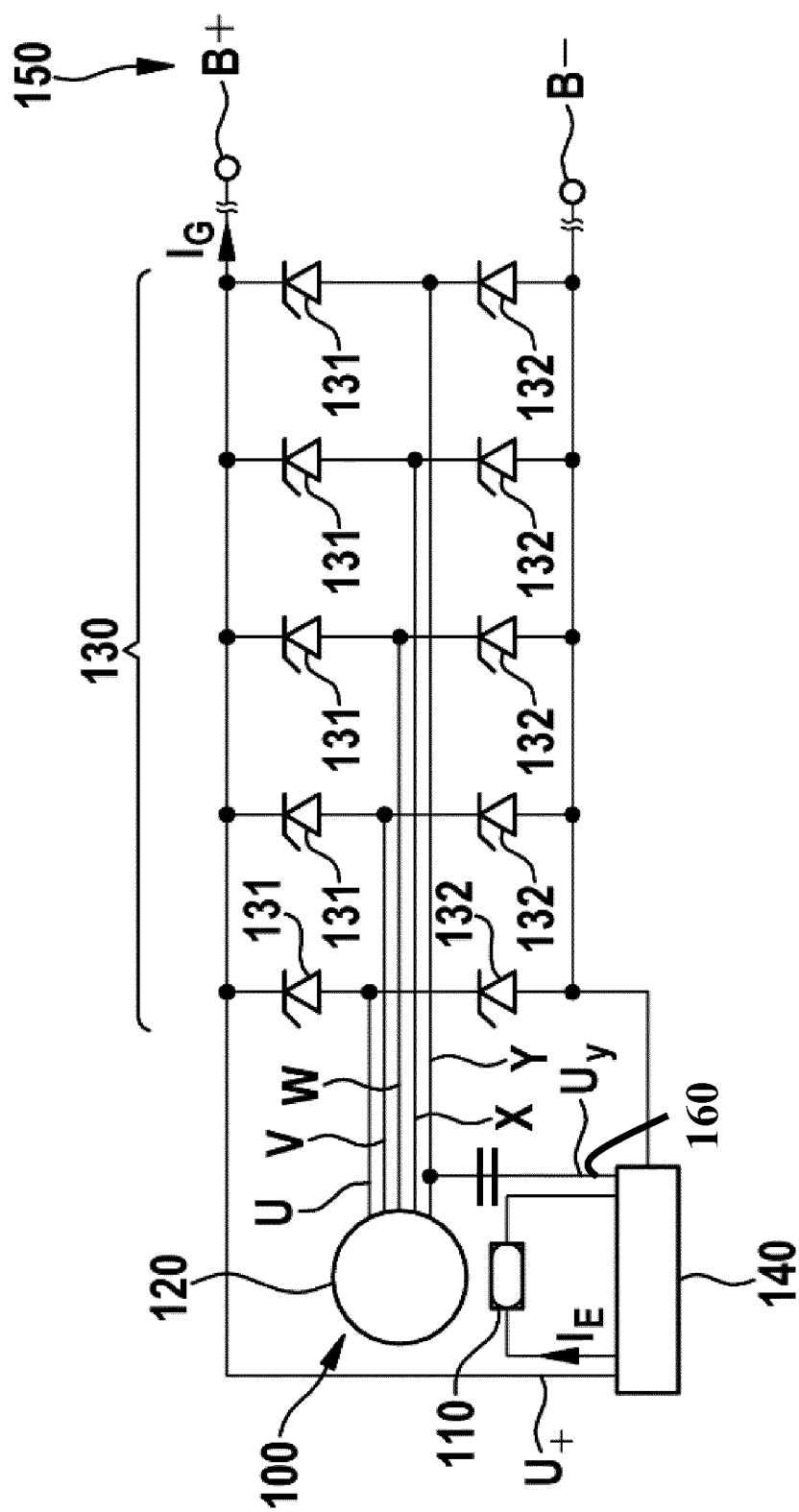
FIG. 6 shows the generator unit from FIG. 1 with an error in the signal line for transmitting the phase voltage.

In FIG. 6, the case of an interruption of the phase signal connection 160 is shown by way of example. In this case, the phase voltage $U_Y$ is not transmitted to the generator controller 140. Instead of that, a constant voltage level is applied to the corresponding input of the generator controller 140, which lies between the voltage level of the high-side B+ of the vehicle electrical system 150 and the voltage level of the low-side B− of the vehicle electrical system 150.

In each of the cases illustrated in FIGS. 2, 3 and 6, including the case of the deliberate introduction of one of the cases illustrated in FIGS. 2 and 3 during the reaction to a load dump, it is no longer possible to detect the speed nG of the generator on the basis of the phase voltage $U_Y$.

Therefore, it is possible to detect the speed nG of the generator depending on the plot of the excitation current if it has been detected that a load dump is present or if it then is detected that the phase voltage $U_Y$ assumes a constant value.

The invention claimed is:

1. A method for determining a speed of a generator unit which has an electric machine with a rotor winding and a stator winding and a rectifier connected thereto, via which rectifier the electric machine is connected to an electrical system of a motor vehicle, the method comprising:
   determining the speed based on a plot of an excitation current flowing through the rotor winding of the electric machine.

2. The method according to claim 1, wherein the speed is determined depending on the plot of the excitation current if an error is present in the generator unit.

3. The method according to claim 2, wherein the speed is determined depending on a plot of a phase voltage if an error is not present in the generator unit.

4. The method according to claim 1, wherein the speed is determined depending on the plot of the excitation current (IE) if the phase voltage is fixed to a constant value.

5. The method according to claim 4, wherein the speed is determined depending on the value of the phase voltage.

6. The method according to claim 5, wherein the speed is determined equal to a frequency of the excitation current divided by the number of pole pairs.

7. The method according to claim 5, wherein the speed is determined equal to a frequency of the excitation current divided by the number of pole pairs multiplied by twice the phase number of the generator if the phase voltage lies between a high-side voltage level and a low-side voltage level of the vehicle electrical system.

8. The method according to claim 1, wherein the speed is detected depending on an analysis of a frequency spectrum of the plot of the excitation current or depending on an edge detection in the plot of the excitation current.

9. The method according to claim 1, wherein a start-up of the generator unit is initiated if it is detected that a frequency of the excitation current lies above a speed threshold.

10. The method according to claim 9, wherein the generator unit is started in a secured operation if an oscillation of the excitation current is greater than a threshold value and the frequency of the excitation current lies above an emergency start frequency.

11. The method according to claim 9, wherein the generator unit is started in a normal operation if an oscillation of the excitation current is smaller than a threshold value and the frequency of the excitation current lies above an emergency start frequency.

12. A generator controller for determining a speed of a generator unit which has an electric machine with a rotor winding and a stator winding and a rectifier connected thereto, via which rectifier the electric machine is connected to an electrical system of a motor vehicle, the generator controller configured to determining the speed based on a plot of an excitation current flowing through the rotor winding of the electric machine.

13. A machine-readable storage medium having a computer program, that when executed by a computer, cause the computer to
   determine a speed of a generator unit, which has an electric machine with a rotor winding and a stator winding and a rectifier connected thereto, via which rectifier the electric machine is connected to an electrical system of a motor vehicle, based on a plot of an excitation current flowing through the rotor winding of the electric machine.

* * * * *